US008375891B2

(12) United States Patent
Nagata et al.

(10) Patent No.: US 8,375,891 B2
(45) Date of Patent: Feb. 19, 2013

(54) VACUUM VAPOR PROCESSING APPARATUS

(75) Inventors: Hiroshi Nagata, Ibaraki (JP); Kyuzo Nakamura, Kanagawa (JP); Takeo Katou, Kanagawa (JP); Atsushi Nakatsuka, Kanagawa (JP); Ichirou Mukae, Kanagawa (JP); Masami Itou, Kanagawa (JP); Ryou Yoshiizumi, Kanagawa (JP); Yoshinori Shingaki, Ibaraki (JP)

(73) Assignee: Ulvac, Inc., Kanagawa (JP)

( * ) Notice: Subject to any disclaimer, the term of this patent is extended or adjusted under 35 U.S.C. 154(b) by 650 days.

(21) Appl. No.: 12/440,635

(22) PCT Filed: Sep. 10, 2007

(86) PCT No.: PCT/JP2007/067573
§ 371 (c)(1),
(2), (4) Date: May 21, 2009

(87) PCT Pub. No.: WO2008/032668
PCT Pub. Date: Mar. 20, 2008

(65) Prior Publication Data
US 2010/0012035 A1    Jan. 21, 2010

(30) Foreign Application Priority Data

Sep. 11, 2006  (JP) ................................ 2006-245303
Sep. 14, 2006  (JP) ................................ 2006-248964

(51) Int. Cl.
*C23C 16/448*  (2006.01)
*C23C 16/455*  (2006.01)
*C23C 16/458*  (2006.01)
*C23C 16/46*  (2006.01)
*C23F 1/00*  (2006.01)
*H01L 21/306*  (2006.01)
*C23C 16/06*  (2006.01)
*C23C 16/22*  (2006.01)

(52) U.S. Cl. .................. 118/723 VE; 118/719; 118/724; 118/726; 118/728; 118/729; 156/345.31; 156/345.37; 156/345.52

(58) Field of Classification Search ............ 118/723 VE, 118/719, 724, 726, 728, 729; 156/345.31, 156/345.37, 345.52
See application file for complete search history.

(56) References Cited

U.S. PATENT DOCUMENTS 3,205,102 A * 9/1965 McCaldin ..................... 438/567
(Continued)

FOREIGN PATENT DOCUMENTS

CN            1276440 A      12/2000
(Continued)

OTHER PUBLICATIONS

International Search Report for PCT Patent App. No. PCT/JP2007/067573 (Nov. 6, 2007).
(Continued)

*Primary Examiner* — Rudy Zervigon
(74) *Attorney, Agent, or Firm* — Cermak Nakajima LLP; Tomoko Nakajima

(57) ABSTRACT

There is provided a vacuum evaporating apparatus which is suitable for performing a process in which a metal vapor atmosphere is formed in a processing chamber, the metal atoms in this metal vapor atmosphere are caused to be adhered to the surface of an object to be processed, and the metal atoms adhered to the surface of the object to be processed are diffused into grain boundary phases thereof. The apparatus comprises: a processing furnace (11); at least one processing box (4) disposed inside the processing furnace; and a heating means (2) provided inside the processing furnace so as to enclose the processing box. An evacuating means is provided which, after housing the processing box inside the processing furnace in a state in which the object to be processed (S) and the metal evaporating material (V) are disposed in the processing box, reduces the processing furnace and the processing box to a predetermined pressure and keep them at that pressure. The heating means is operated in the reduced pressure to evaporate the metal evaporating material while increasing the object to be processed to a predetermined temperature. The evaporated metal atoms are supplied to the surface of the object to be processed.

20 Claims, 7 Drawing Sheets

U.S. PATENT DOCUMENTS

| | | | |
|---|---|---|---|
| 3,524,426 A * | 8/1970 | Ogle, Jr et al. | 118/720 |
| 4,347,431 A * | 8/1982 | Pearce et al. | 219/390 |
| 4,858,557 A * | 8/1989 | Pozzetti et al. | 118/725 |
| 4,926,793 A * | 5/1990 | Arima et al. | 118/730 |
| 4,992,044 A * | 2/1991 | Philipossian | 432/253 |
| 5,238,498 A * | 8/1993 | Bang et al. | 118/719 |
| 5,249,960 A * | 10/1993 | Monoe | 432/77 |
| 5,320,680 A * | 6/1994 | Learn et al. | 118/724 |
| 5,324,920 A * | 6/1994 | Nakao | 219/542 |
| 5,429,498 A * | 7/1995 | Okase et al. | 432/152 |
| 5,443,648 A * | 8/1995 | Ohkase | 118/724 |
| 5,525,158 A | 6/1996 | Tsukazaki et al. | |
| 5,616,264 A * | 4/1997 | Nishi et al. | 219/494 |
| 5,618,351 A * | 4/1997 | Koble et al. | 118/728 |
| 5,651,670 A * | 7/1997 | Okase et al. | 432/5 |
| 5,683,606 A * | 11/1997 | Ushikoshi et al. | 219/544 |
| 5,895,596 A * | 4/1999 | Stoddard et al. | 219/497 |
| 5,902,406 A * | 5/1999 | Uchiyama et al. | 118/724 |
| 5,994,675 A * | 11/1999 | Bethune et al. | 219/483 |
| 6,005,225 A * | 12/1999 | Kowalski et al. | 219/390 |
| 6,207,937 B1 * | 3/2001 | Stoddard et al. | 219/497 |
| 6,211,495 B1 * | 4/2001 | Stoddard et al. | 219/497 |
| 6,391,386 B1 | 5/2002 | Nishiuchi et al. | |
| 6,441,350 B1 * | 8/2002 | Stoddard et al. | 219/497 |
| 7,027,722 B2 * | 4/2006 | Uemori et al. | 392/416 |
| 7,102,104 B2 * | 9/2006 | Saito et al. | 219/390 |
| 7,183,229 B2 * | 2/2007 | Yamanaka | 438/795 |
| 7,771,538 B2 * | 8/2010 | Hwang et al. | 118/728 |
| 2002/0127941 A1 * | 9/2002 | Tamura et al. | 445/6 |
| 2003/0150377 A1 | 8/2003 | Arimoto et al. | |
| 2005/0082281 A1 * | 4/2005 | Uemori et al. | 219/539 |
| 2005/0155557 A1 * | 7/2005 | Hwang et al. | 118/728 |
| 2006/0027170 A1 | 2/2006 | Takeda et al. | |
| 2007/0166219 A1 | 7/2007 | Arimoto et al. | |
| 2010/0032425 A1 * | 2/2010 | Shimada | 219/439 |

FOREIGN PATENT DOCUMENTS

| | | |
|---|---|---|
| CN | 1451057 A | 10/2003 |
| DE | 4336357 A1 | 4/1994 |
| JP | 62074048 | 4/1987 |
| JP | 4088120 | 3/1992 |
| JP | 6307775 | 11/1994 |
| JP | 6-333830 A | 12/1994 |
| JP | 6333830 | 12/1994 |
| JP | 10036183 | 2/1998 |
| JP | 2002105503 | 4/2002 |
| JP | 20044296973 | 10/2004 |
| JP | 2006037189 | 2/2006 |
| JP | 2006118055 | 5/2006 |
| WO | WO2006/100968 | 9/2006 |

OTHER PUBLICATIONS

Office Action for Chinese Patent App. No. 200780033699 (May 21, 2010).

* cited by examiner (a)

|  | Before process | After process (975°C) |
|---|---|---|
| Br(kG) | 14.5 | 14.3 |
| iHc(kOe) | 11.3 | 23.1 |
| (BH)max(MGOe) | 50.5 | 49.9 |
| Weight increase ratio(%) | — | 0.45 |
| (BH)max+iHc | 61.8 | 73 |

VACUUM VAPOR PROCESSING APPARATUS

This application is a national stage filing under 35 U.S.C. §371 of PCT Patent Application No. PCT/JP2007/067573, filed Sep. 10, 2007, which claims priority under 35 U.S.C. §119 to Japanese Patent Application No. 2006-245303, filed on Sep. 11, 2006, and Japanese Patent Application No. 2006-248964, filed on Sep. 14, 2006, which are incorporated in their entireties by reference.

FIELD OF THE INVENTION

The present invention relates to a vacuum vapor processing apparatus suitable for performing a processing (vacuum vapor processing): in which, while heating an object to be processed inside a processing chamber, evaporated metal atoms are caused to be adhered to, and deposited on, a surface of the object to be processed to thereby form a metallic film; and in which, in addition thereto, in case the object to be processed has a crystal structure, the metal atoms are caused to be diffused into the grain boundaries at the same time as the adhesion thereof to the surface of the object to be processed.

BACKGROUND ART

This kind of vacuum vapor processing apparatus is used to improve the magnetic properties of, e.g., a Nd—Fe—B (or a Nd—Fe—B system) sintered magnet, and there is known one which is constituted by a hermetically sealed vessel made up of glass tube, and the like and an electric furnace. In this vacuum vapor processing apparatus, an object to be processed which is the Nd—Fe—B sintered magnet and a metal evaporating material which is rare earth metal selected from the group consisting of Yb, Eu, Sm are contained, in a mixed state, inside the hermetically sealed vessel. The pressure inside the vessel is reduced to a predetermined pressure by means of a vacuum pump or the like and sealed and, thereafter, the above materials are contained inside the electric furnace and are heated (e.g., to 500° C.) while this hermetically sealed vessel is rotated.

Once the hermetically sealed vessel is heated, the metal evaporating material evaporates to thereby form a metal vapor atmosphere inside the hermetically sealed vessel. The metal atoms in the metal vapor atmosphere get adhered to the sintered magnet that has been heated to substantially the same temperature. In addition, as a result of diffusion of the adhered metal atoms into the grain boundary phases of the sintered magnet, the metal atoms are homogeneously introduced in a desired amount into the surface of the sintered magnet and the grain boundary phases, whereby magnetization and coercive force are improved or recovered (patent document 1 and patent document 2).

Patent document 1: JP-A-2002-105503 (see, e.g., FIG. 1 and FIG. 2)
Patent document 2: JP-A-2004-296973 (see, e.g., claims)

DISCLOSURE OF THE INVENTION

Problems to be Solved by the Invention

As a material for a heater and wall to be used in an electric furnace, there is conventionally used carbon considering the ease of workability and cost. It is known, however, that the point of sublimation of carbon lowers under vacuum conditions (e.g., $10^{-4}$ Pa). Therefore, if this kind of electric furnace is used for evaporation of Dy and Tb that must be heated to a temperature of 900° C. or more in vacuum, there occurs a problem in that the furnace is contaminated by the sublimation of carbon, or that Dy and Tb react with carbon, resulting in poor reproducibility of the reaching temperature due to rapid leaning of the heater itself, and the like. In addition, if the sealed vessel for containing therein the metal evaporating material and the object to be processed is constituted by a material such as glass tube and the like that has a possibility of reacting with the metal evaporating material, reaction takes place with the metal atoms in the vapor atmosphere, resulting in formation of product of reaction on the surface. There is a further possibility in that the atoms penetrate into the vapor atmosphere of Dy and Tb, and that the recovery of the metal evaporating material becomes difficult.

In order to further improve the coercivity after having performed the above-described processing particularly to an object of a predetermined shape such as parallelepiped, it is preferable to perform in succession heat treatment at a predetermined pressure and temperature. However, in the above example, since the pressure in the hermetically sealed vessel changes during processing, in order to perform heat treatment after processing at a predetermined pressure, it becomes necessary to once take the hermetically sealed vessel out of the electric furnace and, after pressure reduction, to return it once again to the electric furnace. The handling is therefore troublesome. Further, in order to introduce metal atoms in a desired amount into substantially the entire surface of the sintered magnet, a driving mechanism to rotate the hermetically sealed vessel is required, resulting in a complicated apparatus constitution and a higher cost. Further, since the metal evaporating material and the object to be processed are disposed in a state of mixing them together, there is a disadvantage in that the melted metal evaporated material may get directly adhered to the object to be processed.

Therefore, in view of the above points, a first object of this invention is to provide a vacuum vapor processing apparatus in which the object to be processed and the metal evaporating material can be heated to a high temperature with a high reproducibility in a simple construction without contamination on the inside of the apparatus, and in which, when the vapor atmosphere is formed, the other atoms can be prevented from entering.

A second object of this invention is to provide a vacuum vapor processing apparatus in which the processing chamber can be reduced in pressure at will and which has a simple construction.

Means of Solving the Problems

In order to solve the above problems, the vacuum evaporating apparatus of the invention comprises: a processing furnace; at least one processing box disposed inside the processing furnace; a heating means for heating the processing box; and an evacuating means for evacuating the processing furnace and the processing box to a predetermined pressure in a state in which an object to be processed and a metal evaporating material are disposed in the processing box. The heating means is operated at a reduced pressure to heat the object to be processed to a predetermined temperature at which the metal evaporating material is evaporated so that the evaporated metal atoms are supplied to the surface of the object to be processed.

According to the invention, the heating means is operated to heat the processing box at a reduced pressure. When the metal evaporating material inside the processing box has reached the predetermined temperature, evaporation of the metal evaporating material starts. Then, the evaporated metal atoms move to the object to be processed either directly or from a plurality of directions by repeating collisions and get adhered to, and deposited on, the object to be processed. In case the object to be processed has a crystalline structure, the metal atoms that have been adhered to the surface of the object to be processed that has been heated to substantially the same temperature as the metal evaporating material, are diffused into the grain boundaries of the object to be processed.

According to the invention, preferably the processing box is free to be put into, or taken out of, the processing furnace, and comprises: a box part which is open on an upper surface and a lid part which is detachably mounted on the open upper surface, wherein the processing box is depressurized as a result of depressurization of the processing furnace by operating the evacuating means. According to this arrangement, when the processing furnace is evacuated and depressed until the processing furnace has reached a predetermined pressure, the inner space of the processing box that constitutes the processing chamber is depressurized through the processing furnace to a higher pressure than that of the processing furnace. Therefore, the inside of the processing box that constitutes the processing furnace in a simple construction can arbitrarily be reduced in pressure.

Further, there is arranged, in the processing furnace, the processing box containing therein the metal evaporating material and the object to be processed, in a batch system so as to be freely put into, and taken out of, the processing furnace. Therefore, there is no need of a mechanism and the like for putting and taking the object to be processed into, or out of, the processing box inside the processing furnace. The apparatus itself is of a simple construction. In this case, if an arrangement is made such that a plurality of processing boxes are housed inside the processing furnace so as to process them at the same time, it can cope also with a mass production. In addition, since the inner space can be reduced to a predetermined pressure accompanied by the pressure reduction in the processing furnace, there is no need of the evacuating means for the pressure reduction of the processing box. In addition, even after the evaporation of the metal evaporating material has been stopped, the inside of the processing box can be further reduced in pressure without taking out the processing box. Further, the processing box itself can be made simpler in construction and, in addition, by taking out the lid part, one surface of the box part can be left open. In this manner, the taking the metal evaporating material and the object to be processed into and out of the processing box become easier.

According to the invention, preferably the heating means and the processing box are formed of a material that is free from reaction with the metal evaporating material or are made of a constituting element having formed an inner lining film of a material that is free from reaction with the metal evaporating material. Then, if the metal evaporating material is adhered to the wall surface of the processing box and the like, the material does not react with the wall surface. Therefore, when the metal vapor atmosphere is formed, the other atoms can be prevented from entering, and the recovery of the metal evaporating material adhered to the wall surface becomes easy. This is particularly effective in case the metal evaporating material is Dy and Tb that are scanty as natural resources and stable supply cannot be expected.

Preferably the material that is free from reaction with the metal evaporating material is Mo.

Preferably the heating means comprises an insulating material enclosing the circumference of the processing box and a heat generating member disposed on the inside of the insulating material, wherein the insulating material is made by laminating plural numbers at a predetermined distance from one another. According to this arrangement, the inside of the processing box is indirectly heated through the wall surface of the processing box, it is possible to substantially uniformly heat the inside of the processing box with a good reproducibility. In addition, the processing box is heated by the heating means disposed inside the processing furnace under reduced pressure. Therefore, the thermal efficiency becomes large and the speed of increasing the temperature in the processing chamber can be made faster. Further, if at least the insulating material on the inside of the processing furnace is made of the above-described material, the cost can be lowered.

Further, in this invention, the vacuum evaporating apparatus further comprises a setting part capable of placing thereon the object to be processed at a predetermined height from a bottom surface of the processing box. If this setting part is constituted by disposing a plurality of wire members, only by placing the metal evaporating material on the bottom surface of the processing box, the object to be processed and the metal evaporating material can be disposed at a distance from each other in a simple construction. In case the object to be processed is sintered magnet and the metal evaporating material is rare earth metals, the melted rare earth metals will not be directly adhered to the sintered magnet whose surface Nd-rich phase is melted. In addition, the metal atoms evaporated from the metal evaporating material positioned on the lower side of the object to be processed are supplied either directly or from a plurality of directions by repeating collisions to substantially the entire surface of the object to be processed. Therefore, there is no need of a rotating mechanism to rotate the object to be processed, whereby the construction of the apparatus can be simplified and the cost can be lowered.

On the other hand, there may be provided, inside the processing box, a holding part which is capable of holding therein the metal evaporating material so that the object to be processed can be disposed at a distance from the metal evaporating material. In this case, depending on the area of opening in the holding part, the amount of evaporation of the metal evaporating material can advantageously be adjusted.

The holding part may be disposed on a side wall of the processing box in a manner to enclose the object to be processed.

On the other hand, the holding part may be positioned between objects to be processed that are disposed in the processing box.

The heating means comprises a plurality of communication passages, and gas passages in communication with the communication passages are provided between the heating means and an inner wall of the processing furnace, and the gas passages are connected to an air-cooling means comprising a fan and a heat exchanger. Then, by circulating the gas in the space on the inside of the heating means that has been heated to a high temperature, the object to be processed inside the processing box can be cooled at a desired cooling speed.

In this invention, the object to be processed is a Fe—B-rare earth sintered magnet and the metal evaporating material is at least one of Dy and Tb. It is thus suitable to cause the metal atoms to adhere to the surface of the sintered magnet by adjusting the amount of supply of the metal atoms of Dy Tb in the vapor atmosphere of Dy Tb to the sintered magnet, and to diffuse the metal atoms into the grain boundary phases of the sintered magnet before a thin film made of the metal evaporating material is formed on the surface of the sintered magnet.

EFFECTS OF THE INVENTION

As described hereinabove, according to the vacuum vapor deposition apparatus of this invention, there can be attained effects in that, in a simple construction, the reduction in cost can be obtained, that the object to be processed and the metal evaporating material can be heated to a high temperature with a good reproducibility that the apparatus is not contaminated inside thereof and, when the vapor atmosphere has been formed therein, other atoms can be prevented from entering therein, and that the processing chamber can be appropriately reduced to a desired pressure.

BEST MODE FOR CARRYING OUT THE INVENTION

With reference to FIGS. 1 through 4, a vacuum vapor processing apparatus 1 of the present invention is suitable for performing the processing (vacuum vapor processing): in which an object to be processed is heated in a processing chamber to evaporate the metal evaporation material, so that the evaporated metal atoms are adhered to, or deposited on, the surface of an object to be processed, thereby forming a metallic film; and in which, in addition, in case the object to be processed has a crystalline structure, the metal atoms are diffused into the grain boundaries at the same time as the adhesion to the surface of the object to be processed. The apparatus 1 is used for improvement in the magnetic properties, e.g., of a Nd—Fe—B sintered magnet.

The vacuum vapor processing apparatus 1 has a hollow columnar processing furnace (vacuum chamber) 11. The processing furnace 11 is supported on its longitudinal both sides by two leg pieces 12 disposed on the floor, and opens on one side of a circular shape as seen in side view. This open surface has mounted thereto a dome-shaped open/close door 13 in a manner to be capable of being opened and closed, When this open/close door 13 is closed, the processing furnace 11 is hermetically sealed through a sealing means (not illustrated) which is disposed on an inner periphery thereof. On an outer periphery of the processing furnace 11, there is provided a connection pipe 14. The other end of the connection pipe 14 is connected to a vacuum exhaust means P such as a turbo pump, cryo-pump, diffuser pump, and the like. By operating the vacuum exhaust means in a position at which the open/close door 13 is dosed, the processing furnace 11 can be reduced to a predetermined pressure (e.g, $1 \times 10^{-5}$ Pa) and kept at the pressure.

The processing furnace 11 is provided inside thereof with a heating means 2 which is made up of insulating material 21 enclosing the periphery of the processing box to be described hereinafter, and a heating means 2 constituted by a heat generating element 22 which is disposed on the inside of the insulating material 21. The insulating material 21 is made up of a first part 21a which is hollow and circular in shape and is disposed coaxially with the processing furnace 11 with a circular one side surface, as seen in side view, left open; and a second part 21b which is mounted on an inner surface of the open/close door 13 and is designed to close the opening surface of the first part 21a in a closed position of the open/close door 13. A space 23 enclosed by the insulation material 21 is thus defined inside the processing furnace 11. The first part and the second part 21a, 21b are respectively formed as reflecting surfaces enclosed by the insulating material 21 inside the processing furnace 11. The heat generating element 22 is an electric heater which has a plurality of annular filaments 22a arrayed in the longitudinal direction of the processing furnace 11 at an equal distance to one another. Each of the filaments 22a is supported by a plurality of projected pieces 22b which are formed on the inner wall of the first part 21a in a manner to be projecting radially inward.

The processing furnace 11 is provided with a supporting member 15 which enables to support a setting table to be described hereinafter. The supporting member 15 is made up of: eight supporting bars 15a which are projected in two rows from the bottom surface of the processing furnace 11 through the insulating material 21; and four supporting plates 15b to bridge over the front ends of the two supporting bars 15a that lie next to each other in the longitudinal direction.

The setting part 3 to be placed on the supporting plate 15b is made of a plane plate having an area sufficient to place a plurality of processing boxes which are to be described hereinafter. The placing surface is provided with an opening 31 in honeycomb structure so as to have sufficient strength while enabling to heat the processing boxes from the entire circumference. In this case, the setting table 3 is freely put into, and put out of, the processing furnace 11 through a fork-shaped transfer unit T as the transfer means having a known construction (not illustrated).

As shown in FIG. 4, the processing box 4 to be placed on the setting table 3 is a box which is made up of a box part 41 which is rectangular parallelepiped with the upper surface left open, and a lid part 42 which is capable of being attached to, and detached from, to upper surface of the open box part 41. Inside this processing box 4 there are placed a metal evaporating material V to be appropriately selected depending on the desired vacuum vapor processing and the object to be processed S. On an outer periphery of the lid part 42, a flange 42a which is bent downward is formed over the entire circumference. When the lid part 42 is mounted on the upper surface of the box part 41, the flange 42a is fit into the outer wall of the box part 41 (in this case, vacuum sealing such as metal seal is not provided) to thereby define a processing chamber 40 which is isolated from the processing furnace 11. Then, when the processing furnace 11 is reduced to a predetermined pressure (e.g. $1 \times 10^{-5}$ Pa) via evacuating means, the processing chamber 40 is reduced to a pressure that is higher by half a digit (e.g. $5 \times 10^{-4}$ Pa). Therefore, an additional evacuating means is not necessary and the processing box 4 can appropriately be reduced to a predetermined vacuum pressure. In other words, even after the evaporation of the metal evaporating material V has been finished, the processing chamber 40 can be reduced to a predetermined pressure without taking out the heating box 4 at all.

The volume of the processing chamber 40 is set such that, taking into consideration the mean free path of the metal evaporating material V, the evaporated metal atoms are supplied to the sintered magnet S directly or by repeating the collision from a plurality of directions. The thickness of the wall of the box part 41 and the lid part 42 is set such that they are not thermally deformed when heated by heating means to be described hereinafter. The box part 41 has formed therein a bearing grid 41a which is made by disposing a plurality of wire members (e.g., $\phi 0.1$ to 10 mm in diameter) into grid at a given height from the bottom surface. A plurality of objects S to be processed are put in position on the bearing grid 41a.

According to this arrangement, only by placing the metal evaporating material V on the bottom surface 41b of the box part 41, the object S to be processed and the metal evaporating material V can be placed separate from each other. In addition, the metal atoms evaporated from the metal evaporating material V located on the bottom side of the object S to be processed are supplied substantially to the entire surface of the object to be processed either directly or by repeated collisions from a plurality of directions. Therefore, the processing box 4 need not be rotated. Further, since the processing box 4 is constituted by the box part 41 and the lid part 42, the construction of the processing box 4 itself becomes simple.

When the lid part 42 is removed, the upper surface is left open. As a result, the metal evaporating material V and the object S to be processed can be easily put into, and taken out of, the box part 41. In this case, a batch system is employed in which at least one box 4 containing therein the metal evaporating material V and the object S to be processed is put into, and taken out of, the processing furnace 11. Therefore, there is no need of a mechanism for putting, or taking, the object S to be processed into, and out of, the processing box 4 (i.e., box part 41) within the processing furnace 11. The vacuum evaporating processing apparatus 2 itself can thus be made simple in construction. In addition, if an arrangement is made so that a plurality of processing boxes 4 can be housed, a large amount of objects S to be processed can be processed at the same time, thereby attaining a high productivity.

By the way when $Al_2O_3$ which is ordinarily used in a vacuum apparatus in general is employed as the processing box 4, there is a possibility that Dy in the vapor atmosphere and $Al_2O_3$ react with each other to thereby form a reaction product on the surface thereof and that the Al atoms enter the Dy vapor atmosphere. In addition, in order to evaporate Dy and Tb, it is necessary to heat to a temperature of 900° C. or more in vacuum. Therefore, if carbon is used like in the conventional electric furnace, there is a problem in that the furnace is contaminated inside by sublimation of carbon, that metal evaporating material V such as Dy Tb, Si and the like reacts with carbon, or that water and hydrogen coming out of the object S to be processed react with carbon, whereby the reproducibility of the attained temperature becomes poor due to the heater's own rapid getting thinner.

In the example of the present invention, all the constituting parts present inside the processing furnace 11 such as the parts to constitute the processing box 4, the insulating material 21 and filament 22a to constitute the heating means 2, and the setting table 3 inclusive of the supporting members 15, are made of Mo. According to this arrangement, when the processing box 4 is heated to thereby evaporate therein the metal evaporating material V, the other atoms can be prevented from entering. On the other hand, since the processing box 4 is of a simple construction (substantially sealed construction) in which the lid part 42 is placed on the upper surface of the box part 41, there is a possibility that part of the evaporated atoms leak into the outside through a clearance between the box part 41 and the lid part 42. However, since the insulating material 21 and the setting table 3 are made of Mo, they will not react with the metal evaporating material, the recovery of the metal evaporating material V adhered to the insulating material 21 becomes easy. This is particularly effective with metal evaporating material of Dy and Tb that are particularly scanty as natural resources and cannot expect stable supply.

Further, since the filament 22a is also made of Mo, even when the processing chamber 40 is heated to a high temperature of above 1000° C., there is a high reproducibility of the reaching temperature. Due to the fact that the thermal efficiency becomes high by heating the processing box 4 by operating the heating means 2 after the processing furnace 11 has been reduced in pressure, and due to the fact that the processing chamber 40 is indirectly heated through the wall surfaces of the processing box 4, the processing chamber 40 can be substantially uniformly heated at a short time with a good reproducibility.

In the example of the present invention, although the constituting parts are made of Mo, any material will be acceptable if the processing box can be heated with good reproducibility and does not react with the metal evaporating material. For example, it may be made of an alloy containing at least one of stainless, V, Ta or Mo, V, Ta (including rare earth elements added Mo alloy, Ti added Mo alloy and the like), CaO, $Y_2O_3$ or oxides of rare earth elements. They may be constituted by a product in which a film of these materials is formed on the insulating material as an inner lining.

The insulating material 21 may be constituted by placing a plurality of insulating materials at a given space therebewteen. In this case, by making only the innermost insulating material to be of Mo make, the cost can be lowered. Further, a foil of Mo make or a plate of Mo make for preventing the adhesion may advantageously be mounted on the inner wall of the processing furnace 11. In the example of this invention, a description has been made of an example in which the lid part 42 is fit into the upper opening of the box part 41. However, without limiting to the example, there may be employed an example in which the upper opening of the box part 41 is covered by Mo foil so as to define a processing chamber 40 that is isolated inside the processing furnace 11.

In case the vacuum vapor processing apparatus 1 is constituted as described above, the speed of temperature drop in the space 23 enclosed by the insulating material 21 is low and, therefore, it takes time to take out the processing box 4 that has been processed. As a solution, there is provided a cooling means inside the processing furnace 11. This cooling means is made up of a motor 52 which is disposed inside a housing chamber 51 formed in a projecting manner on the side opposite to the open/close door 13 of the processing furnace 11; a fan 53 which is of a known construction and which is mounted on a rotary shaft 52a of the motor 52; and a tubular body 54 which is elongated from the housing chamber 51 to the neighborhood of one side surface of the first part 21a of the insulating material 21, while enclosing the circumference of the fan 53. In this case, it is so arranged that a coolant (cooling water) can be circulated along the wall surface of the tubular body 54. The tubular body 54 serves the purpose of a heat exchanger.

In the first part and the second part 21a, 21b of the insulating material 21 there are formed a plurality of square openings 55a in a manner to lie opposite to each other. On an outer periphery thereof there are formed a plurality of communication passages 55b at an equal distance to one another. Each of the communication passages 55b is in communication with gas passages 56 which are disposed between the inner wall of the processing furnace 11 and the insulating material 21. One end of the gas passage 56 is connected to the tubular body 54 and the other end of the gas passage 56 is left open. According to the arrangement, the gas can be circulated in the space 23 by operating the motor 52 to rotate the fan 53, whereby the processing box 4 can be arbitrarily cooled.

Therefore, it becomes possible, for example, to perform anneal processing by slowly cooling the object S to be processed after processing it at a high temperature, or to perform quench processing of the object S to be processed by rapidly cooling after heating to a predetermined temperature. In case a square opening 55a is provided in the insulating material 21, there is a possibility that the heating efficiency becomes poor and that part of the evaporated atoms are emitted into the processing furnace 11. As a solution, the square opening 21c is provided with a reflector plate 21c which lies in close proximity thereto and which has an area larger than the square opening 55a. The reflector plate 21c is also made of Mo with a reflecting layer formed on the inner surface.

The processing furnace 11 is provided with a gas introduction means 6 which enables rare gas such as Ar and the like to be introduced therein. The gas introduction means 6 is in communication with a gas supply source and has a gas pipe 61 with a mass flow controller interposed therein. The gas introduction means 6 is used when a predetermined amount (e.g., 10 kPa) of Ar gas is introduced after the vacuum vapor processing has been performed for a predetermined period of time, to thereby stop evaporation of the metal evaporating material V. If the processing furnace 11 is reduced in pressure by using the vacuum evaporating means after the evaporation of the metal evaporating material V has been stopped, the processing chamber 40 can be reduced in pressure to a pressure which is higher than the processing furnace 11 nearly by half a digit.

In the example of this invention, a description has been made of an example in which the lid part 42 is fit into the upper opening of the box part 41. However, without limiting to the example, there may be employed an example in which the upper opening of the box part 41 is covered by Mo foil so as to define a processing chamber 40 that is isolated inside the processing furnace 11.

In the example of the invention, a description has been made of an example in which a bearing grid 41a is provided in the processing chamber 40. Without limiting thereto, another example may be employed in which the object S to be processed and the metal evaporating material V are disposed apart from each other within the processing chamber 40 so that the metal evaporating material V can be prevented from getting adhered to the object S to be processed and so that the evaporated metal atoms can be supplied to most of the surface of the object S to be processed. In addition, although a description has been made of an example in which the heating means 2 is provided inside the processing furnace 11, anything else is acceptable as long as it can heat the processing box 4 to a predetermined temperature; the heating means may be disposed on an outside of the processing box 4.

Further, as shown in FIGS. 5 through 7, in order to arrange that the specific surface area of the metal evaporating material V is small so that the amount of evaporation of the metal evaporating material can be reduced, holding parts 431, 432, 433 which are recessed in cross section are provided inside the processing box 4, thereby holding therein bulk-form or granular metal evaporating material V. The first holding part 431 is disposed in at least two in number at an equal distance in the circumferential direction of the side wall so as to be positioned around the objects S to be processed that are disposed on the bottom in parallel with each other (see FIG. 5). In this case, they may be formed into an annular shape so as to extend over the entire inner wall of the box part 41. The second holding part 432 is disposed on the bottom in a plurality of numbers at a predetermined distance to each other, and the objects S to be processed are disposed therearound (see FIG. 6). Further, the third holding part 433 is suspended from the lower surface of the lid part 42 (see FIG. 7). In this case, slit-like openings 433a are provided on an outer periphery of the holding part 433 so that the evaporated metal atoms can be supplied to the objects S to be processed. In this arrangement, the amount of supply can advantageously be adjusted depending on the area of the opening.

Now, with reference to FIGS. 1 through 4 and 8, a description will be made of an improvement in the magnetizing properties and coercive force of the sintered magnet S by the vacuum vapor processing using the above-described vacuum vapor processing apparatus 1. The Nd—Fe—B sintered magnet S which is the object to be processed is manufactured in the following manner. That is, Fe, B, Nd, Co are mixed at a predetermined composition to obtain an alloy of 0.05 mm~0.5 mm by the known pre-cast method. Alternatively an alloy of about 5 mm thick may be made by the known centrifugal casting method. A small amount of Cu, Zr, Dy Tb, Al or Ga may be added therein during the formulation. Then the manufactured alloy member is once ground by the known hydrogen grinding process and then pulverized by the jet-mill pulverizing process.

The sintered magnet mentioned above can be manufactured by forming the ground material to a predetermined configuration such as a rectangular parallelopiped or a cylinder in a mold by using magnetic field orientation. It may be possible to further improve the magnetic properties when performed the vacuum vapor processing on the sintered magnet if the sintered magnet S has been heat treated to remove its strain for a predetermined period (e.g. two hours) under a predetermined temperature (in the region of 400° C.~700° C.) after the sintering process.

It is preferable to optimize conditions in each manufacturing step of the sintered magnet S so that the average grain diameter has a range of 1 μm~5 μm or 7 μm~20 μm. If the mean grain diameter is larger than 7 μm, since the spinning force of the grains during generation of the magnetic field is increased, the degree of orientation is improved and additionally the surface area of grain boundary phases is reduced, it is possible to efficiently diffuse at least one of Dy and Tb and thus to obtain a permanent magnet M having a remarkably high coercive force. If the mean grain diameter is larger than 25 μm, the rate in the grain boundary of grains including different grain orientation in one grain is extremely increased and the degree of orientation is deteriorated and as the result of which the maximum energy product, remanent flux density and the coercive force are reduced.

On the other hand, if the mean grain diameter is smaller than 5 μm, the rate of single domain grains is increased and, as a result, a permanent magnet having very high coercive force can be obtained. If the mean grain diameter is smaller than 1 μm, since the grain boundary becomes small and complicated, the time required for performing the diffusing process must be extremely extended and thus the productivity is worsened. As the sintered magnet S, the smaller the amount of oxygen content, the larger becomes the speed of diffusion of Dy and Tb into the grain boundary phases. Therefore, the oxygen content of the sintered magnet S itself may be 3000 ppm, preferably below 2000 ppm, and most preferably below 1000 ppm.

It is possible to use as the metal evaporating material V an alloy including at least one of Dy and Tb remarkably improving the grain magnetic anisotropy of principal phase. In this case it may be possible to include therein Nd, Pr, Al, Cu, Ga etc. in order to further improve the coercive force. In addition the metal evaporating material V is made as a bulk-form alloy formulated at a predetermined mixing ratio and heated e.g. in an arc furnace and then arranged in the processing chamber described below.

Then, the sintered magnet S manufactured in the above-described method is placed on the bearing grid 41a of the box part 41, and the Dy which is the metal evaporating material V is placed on the bottom surface of the box part 41 (as a result, the sintered magnet S and the metal evaporating material V are disposed apart from each other in the processing chamber 40). In this state, the lid part 42 is mounted on the open upper surface of the box part 41 and is then placed on the setting table 3. By operating the transport means the setting table 3 is housed by means of the fork-shaped transport part T into the predetermined position in which a position in which the setting part 3 is supported by the supporting members 15. Then, when the open/close door 13 is closed, the processing furnace 11 is hermetically sealed. The processing box 4 is positioned in the space 23 to be enclosed by the insulating material 21 inside the processing furnace 11 (see FIGS. 1 and 2).

Then, the processing furnace 11 is evacuated to a predetermined pressure (e.g. $1\times10^{-5}$ Pa) via an evacuating means (the processing chamber 40 is evacuated to a pressure that is higher by half a digit). When the processing chamber 40 has reached a predetermined pressure, the heating means 2 is operated to heat the processing box 4. When the temperature inside the processing chamber 40 has reached a predetermined temperature at reduced pressure, Dy disposed on the bottom surface of the processing chamber 40 is heated to substantially the same temperature to thereby start evaporation. A vapor atmosphere is thus formed inside the processing chamber 40. When Dy starts evaporation, since the sintered magnet S and Dy are disposed at a distance from each other, there is no possibility that the melted Dy directly gets adhered to the sintered magnet S. Then, Dy atoms in the Dy vapor atmosphere are supplied, directly or through collision, toward the surface of the sintered magnet S that has been heated to substantially the same temperature as Dy from a plurality of directions, and get adhered thereto. The adhered Dy is diffused into the grain boundary phases of the sintered magnet S, thereby obtaining the permanent magnet M.

In vacuum vapor processing, in order to improve the magnetic properties and production efficiency, it is preferable to attain a uniform diffusion into the grain boundary phase of the sintered magnet before the formation of the thin film on the surface of the sintered magnet S. For this purpose, it is preferable to dispose Dy in bulk state (substantially spherical) which is small in surface area per unit volume (specific surface area) at the bottom of the processing chamber 40 so as to reduce the amount of evaporation at a predetermined temperature. In addition, it is preferable to control the heating means 2 to set the temperature inside the processing chamber 20 to 800° C.~1050° C., preferably 900° C.~1000° C. (for example, at the temperature inside the processing chamber of 900° C.~1000° C., the saturated vapor pressure of Dy becomes about $1\times10^{-2}$~$1\times10^{-1}$ Pa).

If the temperature in the processing chamber 40 (accordingly the heating temperature of sintered magnet S) is lower than 800° C., diffusion velocity of Dy atoms deposited on the surface of sintered magnet S into the grain boundary phases is decreased and thus it is impossible to make the Dy atoms to be diffused and homogeneously penetrated into grain boundary phases of the sintered magnet S before the thin film is formed on the surface of sintered magnet S. On the other hand, if the temperature exceeds 1050° C., the vapor pressure of Dy is increased and thus Dy atoms in the vapor atmosphere are excessively supplied onto the surface of sintered magnet S. In addition, it is afraid that Dy would be diffused into grains and if so, since the magnetization in the grains is greatly reduced, the maximum energy product and the remanent flux density are further reduced.

In order to diffuse Dy into the grain boundary phases before the thin film of Dy is formed on the surface of sintered magnet S, the ratio of a total surface area of the bulky Dy placed on the bottom surface of the processing chamber 40 to a total surface area of the sintered magnet S placed on the bearing grid 41a of the processing chamber 40 is set to be a range of $1\times10^{-4}$~$2\times10^{3}$. In a ratio other than the region of $1\times10^{-4}$~$2\times10^{3}$, there are cases where a thin film of Dy and Tb is formed on the surface of sintered magnet S and thus a permanent magnet having high magnetic properties cannot be obtained. In this case, a preferable range of the ratio is $1\times10^{-3}$~$1\times10^{3}$, and more preferable range is $1\times10^{-2}$~$1\times10^{2}$.

This enables the amount of supply of Dy atoms to the sintered magnet S to be suppressed due to the reduction of the vapor pressure as well as the evaporation amount of Dy and also enables the diffusion velocity to be accelerated due to heating of the sintered magnet S in a predetermined range of temperature with making the average grain diameter of sintered magnet S to be included in a predetermined range. Accordingly it is possible to efficiently and homogeneously diffuse and penetrate the Dy atoms deposited on the surface of the sintered magnet S into the grain boundary phases of the sintered magnet S before they deposit on the surface of the sintered magnet s and form the Dy layer (thin film) (see FIG. 8). As a result, it is possible to prevent the surface of permanent magnet M from being deteriorated and the Dy atoms from being excessively diffused into grains near the surface of sintered magnet. In addition, it is possible to obtain a permanent magnet M in which excessive diffusion of Dy atoms into grain boundaries near the surface of the sintered magnet is restrained, which has high magnetic properties with effective improvement in magnetization and coercive force with Dy-rich phase (a phase including Dy in the range of 5~80%) in the grain boundary phases and, in addition, which is superior in productivity without the need of finish working.

When the manufactured sintered magnet is formed to a desired configuration by wire cutting, the magnetic properties of the sintered magnet would be sometimes extremely deteriorated due to generation of cracks in grains in the principal phase of the surface of sintered magnet. However since the Dy-rich phase is formed inside of the cracks of grains near the surface of the sintered magnet by performing the vacuum vapor processing, the magnetizing properties and coercive force are recovered.

Cobalt (Co) has been added in the neodymium magnet of the prior art to prevent corrosion of the magnet. However, according to the present invention, since Dy-rich phase having extremely high corrosion resistance and atmospheric corrosion resistance as compared with Nd exists in the inside of cracks of grains near the surface of the sintered magnet and grain boundary phases, it is possible to obtain a permanent magnet having extremely high corrosion resistance and atmospheric corrosion resistance without using Co. Furthermore since there is not any intermetallic compound including Co in the grain boundary phases of the sintered magnet S, the metal atoms of Dy and Tb deposited on the surface of the sintered magnet S are further efficiently diffused.

Finally after the process mentioned above have been performed a predetermined period of time (e.g. 4~48 hours), the operation of the heating means 2 is stopped, Ar gas of 10 KPa is introduced into the processing furnace 11 through a gas introducing means 6, evaporation of the metal evaporating material V is stopped and, at the same time, the motor 52 is operated to cool the processing furnace 11 and the temperature in the processing chamber 40 is once lowered to 500° C. Continuously the heating means 2 is operated again, the temperature in the processing chamber 40 is set in a range of 450° C.~650° C., and heat treatment is carried out to further improve the coercive force. Finally after the processing chamber 40 is rapidly cooled substantially to room temperature and the heat the processing furnace 11 is vented, the open/close door 13 is opened and the setting table 3 is taken out by the transporting means.

In the example of the present invention, although it has been described that Dy is used as metal evaporating material V, it is also possible to use Tb having a low vapor pressure in a range of heating temperature (900° C.~1000° C.) of the sintered magnet S enabling to accelerate the optimum diffusion velocity. Otherwise, an alloy may be used which includes at least one of Dy and Tb. When the metal evaporating material V is Tb, the evaporating chamber may be heated in a range of 900° C.~1150° C. If the temperature is lower than 900° C., the vapor pressure cannot reach a level enabling to supply the Tb atoms to the surface of the sintered magnet S. On the other hand, at a temperature exceeding 1150° C., Tb is excessively diffused into the grains and thus the maximum energy product and the remanent flux density are lowered.

In the example of the present invention, description has been made of an example of improving the magnetic characteristics of the Nd—Fe—B sintered magnet as an applicable example of the vacuum vapor processing apparatus 1. It is, however, not limited thereto but the vacuum vapor processing apparatus 1 of the present invention may be used in manufacturing, e.g., a hard metal material, hard material and ceramic material.

In other words, the hard metal material, hard material and ceramic material to be manufactured in powder metallurgy is made up of a principal phase and a grain boundary phase (binder phase) that becomes a liquid phase at the time of sintering. The liquid phase is generally manufactured by grinding the entire amount in a state of being mixed with the principal phase to thereby obtain raw meal, and then by sintering the raw meal after molding it in a known molding method. In case the above materials are manufactured by using the above vacuum vapor processing apparatus 1, only the principal phase (in this case, liquid phase may partly be contained) is first ground to obtain raw meal. After molding the raw meal in a known molding method, the liquid phase composition is supplied by the above vacuum vapor processing before sintering, during sintering, or after sintering.

According to this arrangement, by subsequently supplying the molded principal phase with the liquid phase, peculiar grain phase composition can be obtained due to shortened time of reaction with the principal phase and due to high-concentration demixing or segregation into the grain boundary phase, and the like. As a result, it becomes possible to manufacture a hard metal material, hard material and ceramic material having mechanical strength, particularly having a high toughness value.

For example, SiC powder and C powder (carbon black) of average particle size of 0.5 μm are mixed in molar ratio of 10:1 to obtain raw meal. The raw meal is then molded in a known method to obtain a predetermined shape of molded body (principal phase). Then, this molded body is made to be an object S to be processed and also Si is selected as a metal evaporating material V. They are contained in the processing box 4 and the lid part 42 is mounted on the opened upper surface of the box part 41. Thereafter, the processing box 4 is placed in a predetermined position in which the circumference is enclosed by the heating means 2 inside the processing furnace 11.

Then, the processing furnace 4 is depressurized by evacuating via an evacuating means until it reaches a predetermined pressure (e.g. $1 \times 10^{-5}$ Pa) (the processing chamber 40 is evacuated to a pressure that is higher by about half a digit). When the processing furnace 4 has reached a predetermined temperature (e.g., 1500° C.~1600° C.), the Si that is disposed on the bottom surface of the processing chamber 40 starts evaporation as a result of heating to substantially the same temperature as the processing furnace 40, whereby the Si vapor atmosphere is formed in the processing chamber 40. If this state is maintained for a predetermined period of time (e.g., for 2 hours), the liquid phase component which is Si is supplied together with the sintering of the principal phase which is the molded body, thereby manufacturing the silicon carbide ceramic.

The silicon carbide ceramic manufactured in the above-described method has a bending strength exceeding 1400 MPa and its fracture toughness is 4 MPa·m³. In this case, it can be seen that this product had a higher mechanical strength as compared with the one that was obtained by: mixing SiC powder and C powder (carbon black) of an average particle size of 0.5 μm at a molar ratio of 10:2 to thereby obtain raw meal; molding the raw meal in a known method; and then sintering it to thereby obtain the product (bending strength: 340 MPa, fracture toughness: 2.8 MPa·m³). It is to be noted that a mechanical strength equivalent to the above can also be obtained in case silicon carbide ceramic is obtained by: sintering a molded body under predetermined conditions (1600° C., 2 hours); and then supplying the composition of the liquid phase material which is Si by using the vacuum vapor processing apparatus 1.

EXAMPLE 1

As a Nd—Fe—B sintered magnet, a member machined to a cylinder (10 mm φ×5 mm) having a composition of 30Nd-1B-0.1Cu-2Co-bal.Fe, content of the sintered magnet S itself of 500 ppm, and average grain diameter of 3 μm was used. In this example, the surface of the sintered magnet S was finished as having the surface roughness of 20 μm or less and then washed by acetone.

Then, as shown schematically in FIG. 9, a processing box 4 was housed inside the vacuum chamber 10b which has connected thereto an evacuating means 10a and a vacuum vapor processing apparatus (experimental apparatus) 10 which is arranged to heat the processing box 4 under a predetermined pressure and temperature. Dy atoms were caused to be adhered to the surface of the sintered magnet S in the method as described above and were diffused into the grain boundary phase before the thin film is formed on the surface of the sintered magnet S, thereby obtaining a permanent magnet M (vacuum vapor processing). In this example, the sintered magnet S was placed on the bearing grid 41a in the processing chamber 40, and Dy of 99.9% degree of purity was used as the metal evaporating material. The metal evaporating material is of a bulk configuration and the total weight of 1 g of the metal evaporating material was placed on the bottom surface of the processing chamber 40.

Then the vacuum chamber was once reduced to $1 \times 10^{-4}$ Pa (the pressure in the processing chamber was $5 \times 10^{-3}$ Pa) by activating the evacuating means and the temperature of the processing chamber 40 heated by the heating means 2 was set at 975° C. The vacuum vapor processing was performed for 12 hours after the temperature in the processing chamber 40 had reached 975° C.

COMPARATIVE EXAMPLE 1

A film-forming process was performed against the sintered magnet S same as that used in the Example 1 using a vapor deposition apparatus (VFR-200M/ULVAC machinery Co. Ltd.) of a resistor heater type using a Mo board of the prior art. In this Comparative Example 1, an electric current of 150 A was supplied to the Mo board and performed the film-forming process for 30 minutes after Dy of 2 g had been set on the Mo board and the vacuum chamber had been evacuated to $1 \times 10^{-4}$ Pa.

FIG. 10 is a photograph showing a surface condition of the permanent magnet obtained by performing the processing described above and FIG. 10 (a) is a photograph of the sintered magnet S (before processing). It is found from this photograph that in the sintered magnet S of "before processing" although black portions such as voids of Nd-rich phase being grain boundary phase or de-grain traces can be seen, the black portions disappear when the surface of the sintered magnet is covered by the Dy layer (thin film) as in the Comparative Example 1 (see FIG. 10 (b)). In this case the measured value of thickness of the Dy layer (thin film) was 40 μm. On the contrary it is found in the Example 1 that black portions such as voids of Nd-rich phase or de-grain traces can be seen and thus are substantially same as those of the surface of sintered magnet of "before processing". In addition it is found that Dy has been efficiently diffused into the grain boundary phases before formation of the Dy layer because of the fact of weight variation (see FIG. 10 (c)).

FIG. 11 is a table showing the magnetic properties of the permanent magnet M obtained in accordance with conditions described above. Magnetic properties of the sintered magnet S "before process (or before processing)" is shown in the table as a comparative example. According to this table it is found that, while the coercive force was 11.3 KOe with the sintered magnet S before vacuum vapor processing, the permanent magnet M of the Example 1 has the maximum energy product of 49.9 MGOe, the remanent flux density of 14.3 kG, and the coercive force of 23.1 kOe, and thus the coercive force can be seen to be remarkably improved.

BRIEF DESCRIPTION OF THE DRAWINGS

FIG. 11 is a table showing the magnetic properties of a permanent magnet manufactured in accordance with Example 1 of this invention.

Figure 1:
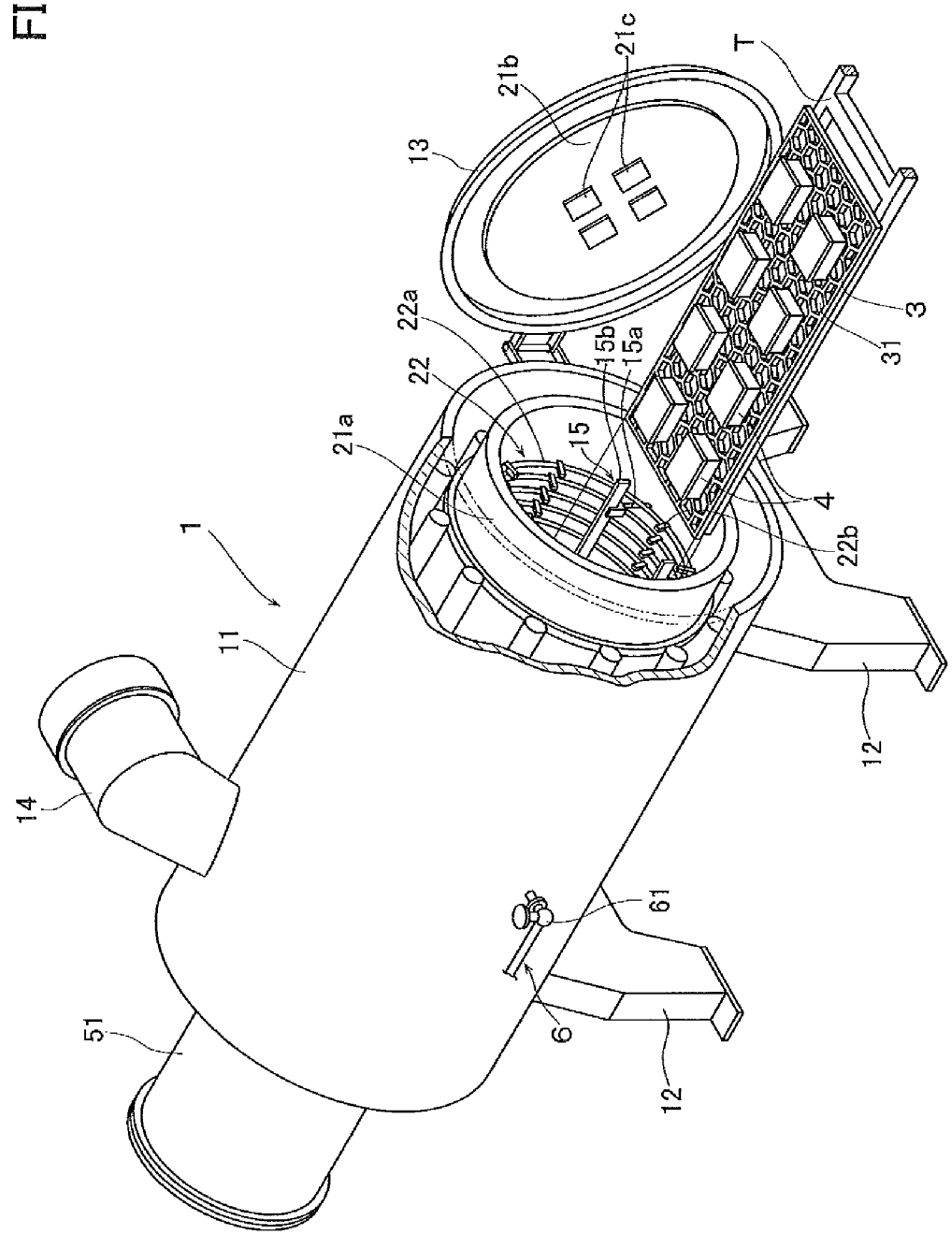
FIG. 1 is a perspective view schematically explaining the construction of a vacuum vapor processing apparatus.
Figure 2:
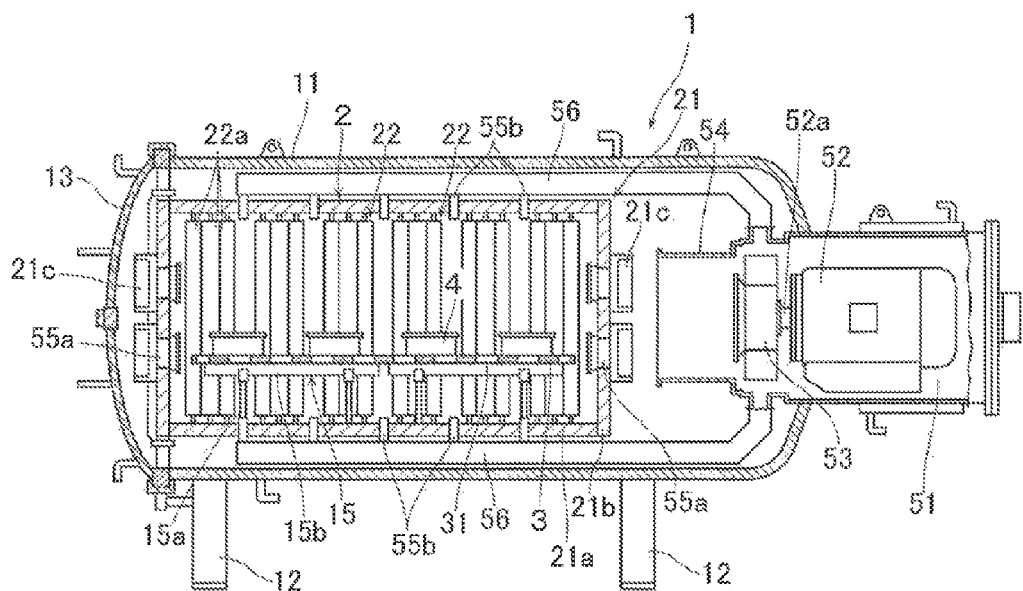
FIG. 2 is a sectional view explaining the construction of a vacuum vapor processing apparatus.
Figure 3:
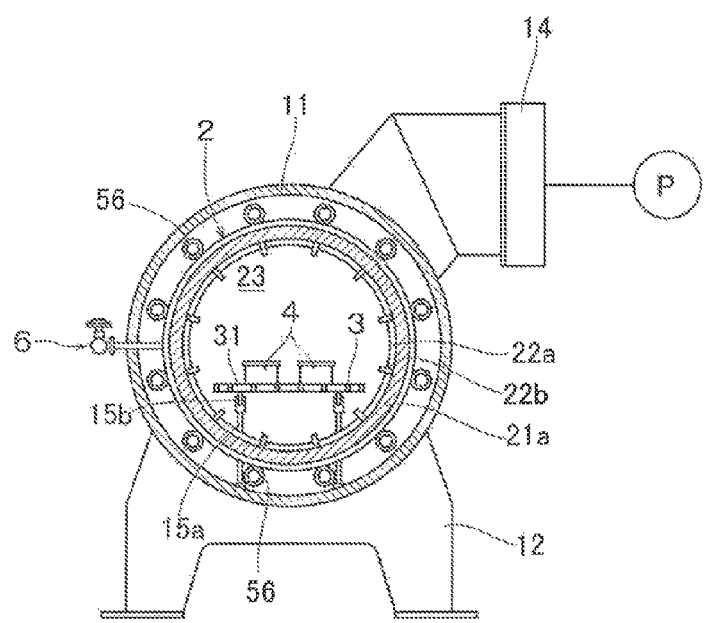
FIG. 3 is a front view explaining the construction of a vacuum vapor processing apparatus.
Figure 4:
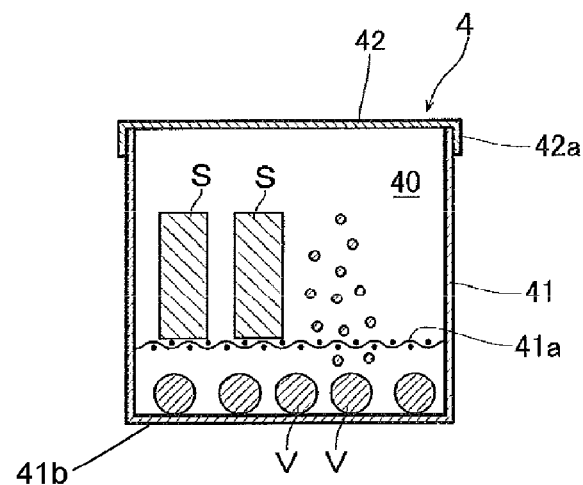
FIG. 4 is a sectional view explaining the processing box.
Figure 5:
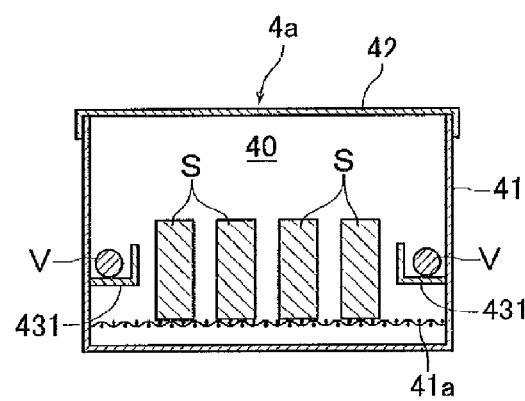
FIG. 5 is a sectional view showing a modified example of disposing an object to be processed and a metal evaporating material.
Figure 6:
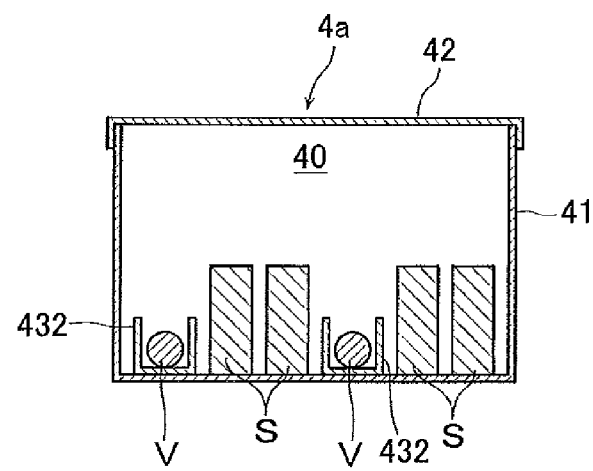
FIG. 6 is a sectional view showing still another modified example of disposing the object to be processed and the metal evaporating material.
Figure 7:
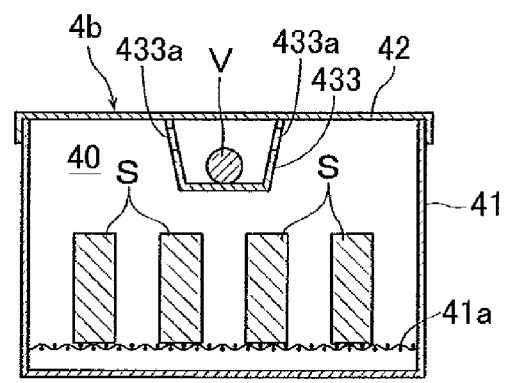
FIG. 7 is a sectional view showing still another modified example of disposing the object to be processed and the metal evaporating material.
Figure 8:
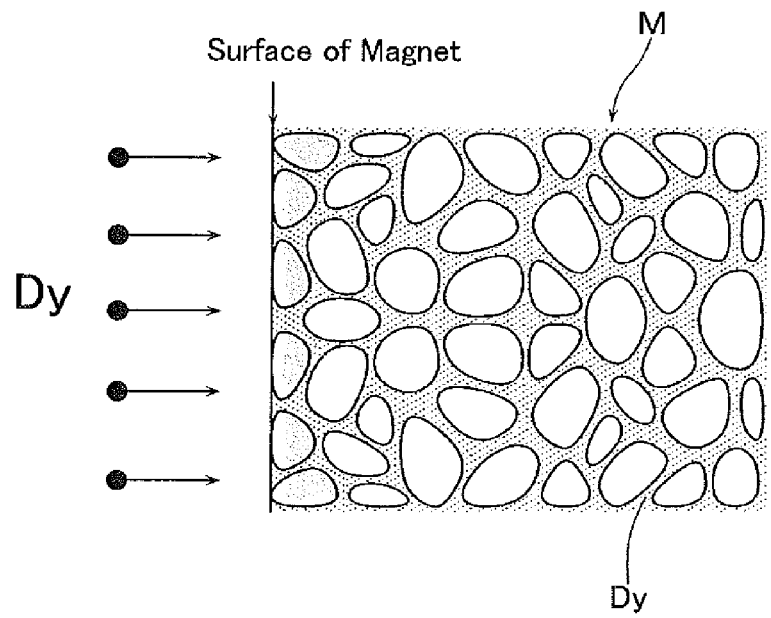
FIG. 8 is a figure schematically explaining the section of a permanent magnet manufactured by using the vacuum vapor processing apparatus of this invention.
Figure 9:
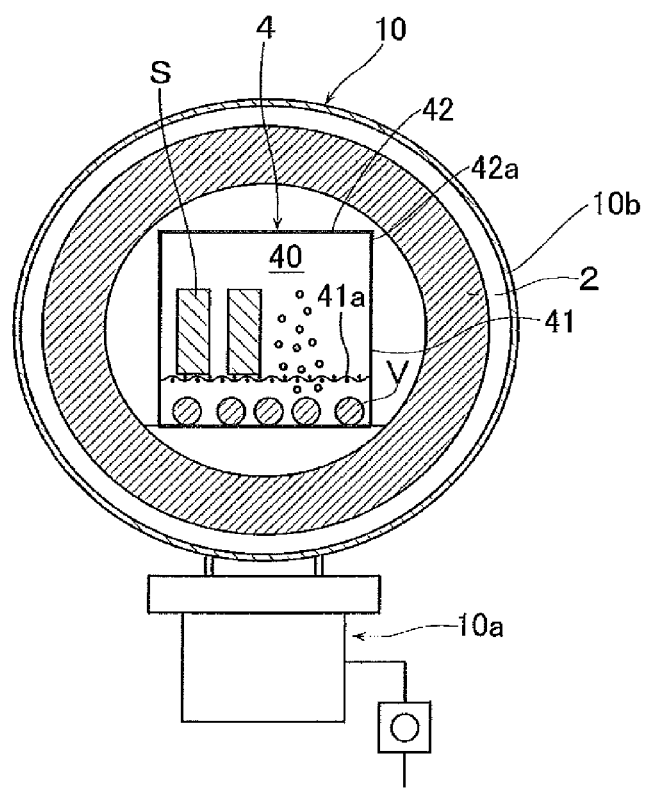
FIG. 9 is a sectional view schematically explaining the construction of the vacuum vapor processing apparatus used in Example 1.
Figure 10:
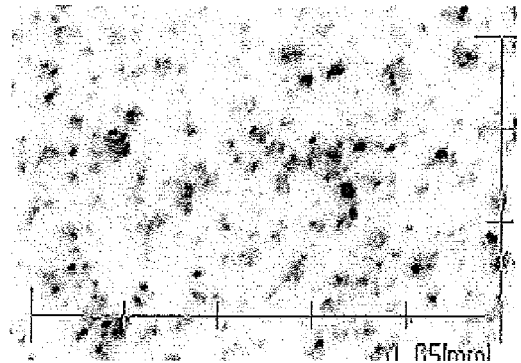
FIG. 10 is an enlarged surface of the permanent magnet manufactured by using the vacuum vapor processing apparatus of this invention.
Figure 10:
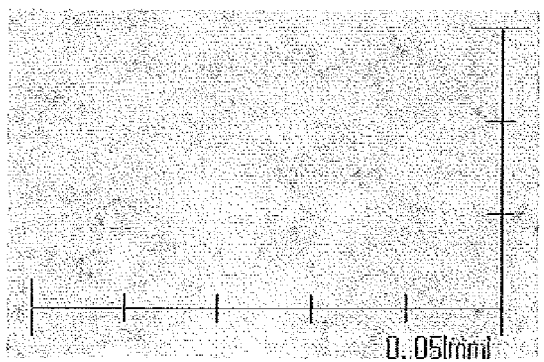
Figure 10:
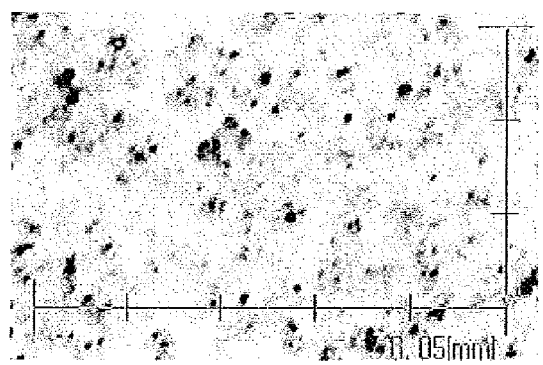

DESCRIPTION OF REFERENCE NUMERALS AND CHARACTERS 1 vacuum vapor processing apparatus
11 processing furnace
2 heating means
21 insulating material
22 heat generating element
3 setting table (setting part)
4 processing box
40 processing chamber
41 box part
42 lid part
54 heat exchanger
55b communicating passage
56 gas passage
S object to be processed
V metal evaporating material

What is claimed is:

1. A vacuum evaporating apparatus comprising:
a processing furnace;
at least one processing box disposed inside the processing furnace;
a heating means for heating the processing box; and
an evacuating means, connected to the processing furnace for evacuating the processing furnace to a predetermined pressure in a state in which an object to be processed and a metal evaporating material are disposed in the processing box,
wherein the processing box, being free to be put into, or taken out of the processing furnace, comprises:
a box part which is open on an upper surface;
a lid part which is detachably mounted on the open upper surface; and
a flange which is bent downward and formed on an entire outer periphery of the lid part such that when the lid part is mounted on the upper surface of the box part, the flange is fit into an outer wall of the box part free from a vacuum sealing means therebetween, thereby defining a processing chamber isolated from the processing furnace,
whereby, after evacuation of the processing furnace to a predetermined pressure and, as a consequent evacuation of the processing chamber to a pressure that is higher than the pressure in the processing furnace, the object to be processed is heated to a temperature at which the metal evaporating material is evaporated, thereby supplying evaporated metal atoms to the surface of the object to be processed.

2. The vacuum evaporating apparatus according to claim 1, wherein the processing box is depressurized as a result of depressurization of the processing furnace by operating the evacuating means.

3. The vacuum evaporating apparatus according to claim 1, wherein the heating means and the processing box are formed of a material that is free from reaction with the metal evaporating material or are made of a constituting element having formed an inner lining film of a material that is free from reaction with the metal evaporating material.

4. The vacuum evaporating apparatus according to claim 3, wherein the material that is free from reaction with the metal evaporating material is Mo.

5. The vacuum evaporating apparatus according to claim 1, wherein the heating means comprises
an insulating material enclosing the circumference of the processing box and
a heat generating member disposed on the inside of the insulating material,
wherein the insulating material is made by laminating plural numbers at a predetermined distance from one another.

6. The vacuum evaporating apparatus according to claim 1, further comprising
a setting part capable of placing thereon the object to be processed at a predetermined height from a bottom surface of the processing box, wherein the setting part is constituted by disposing a plurality of wire members.

7. The vacuum evaporating apparatus according to claim 1, further comprising
a holding part which is capable of holding therein the metal evaporating material.

8. The vacuum evaporating apparatus according to claim 7, wherein the holding part is disposed on a side wall of the processing box in a manner to enclose the object to be processed.

9. The vacuum evaporating apparatus according to claim 7, wherein the holding part is positioned between objects to be processed that are disposed in the processing box.

10. The vacuum evaporating apparatus according to claim 5, wherein the heating means comprises
a plurality of communication passages, gas passages in communication with the communication passages are provided between the heating means and an inner wall of the processing furnace, and
the gas passages are connected to an air-cooling means comprising a fan and a heat exchanger.

11. The vacuum evaporating apparatus according to claim 1,
wherein the object to be processed is Fe-B-rare earth sintered magnet and
wherein the metal evaporating material is at least one of Dy and Tb.

12. The vacuum evaporating apparatus according to claim 2, wherein the heating means and the processing box are formed of a material that is free from reaction with the metal evaporating material or are made of a constituting element having formed an inner lining film of a material that is free from reaction with the metal evaporating material.

13. The vacuum evaporating apparatus according to claim 2,
wherein the heating means comprises
an insulating material enclosing the circumference of the processing box and
a heat generating member disposed on the inside of the insulating material,
wherein the insulating material is made by laminating plural numbers at a predetermined distance from one another.

14. The vacuum evaporating apparatus according to claim 3,
wherein the heating means comprises
an insulating material enclosing the circumference of the processing box and
a heat generating member disposed on the inside of the insulating material,
wherein the insulating material is made by laminating plural numbers at a predetermined distance from one another.

15. The vacuum evaporating apparatus according to claim 4,
wherein the heating means comprises
an insulating material enclosing the circumference of the processing box and
a heat generating member disposed on the inside of the insulating material,
wherein the insulating material is made by laminating plural numbers at a predetermined distance from one another.

16. The vacuum evaporating apparatus according to claim 2, further comprising
a setting part capable of placing thereon the object to be processed at a predetermined height from a bottom surface of the processing box, wherein the setting part is constituted by disposing a plurality of wire members.

17. The vacuum evaporating apparatus according to claim 3, further comprising
a setting part capable of placing thereon the object to be processed at a predetermined height from a bottom surface of the processing box, wherein the setting part is constituted by disposing a plurality of wire members.

18. The vacuum evaporating apparatus according to claim 2, further comprising
a holding part which is capable of holding therein the metal evaporating material.

19. The vacuum evaporating apparatus according to claim 3, further comprising
a holding part which is capable of holding therein the metal evaporating material.

20. The vacuum evaporating apparatus according to claim 1, wherein the processing box which the metal evaporating material is placed on is enclosed from all directions in the processing furnace.

* * * * *